(12) United States Patent
Judd

(10) Patent No.: US 6,262,654 B1
(45) Date of Patent: Jul. 17, 2001

(54) AUDIBLE ALARM-WIRE IDENTIFIER

(76) Inventor: Jimmie Lee Vernon Judd, 4728 Illustrious St., Las Vegas, NV (US) 89147

( * ) Notice: Subject to any disclaimer, the term of this patent is extended or adjusted under 35 U.S.C. 154(b) by 0 days.

(21) Appl. No.: 09/669,173

(22) Filed: Sep. 25, 2000

Related U.S. Application Data

(63) Continuation-in-part of application No. 09/543,902, filed on Apr. 6, 2000.

(51) Int. Cl.[7] ..................................................... G08B 3/00
(52) U.S. Cl. ................................... 340/384.1; 340/384.6; 340/384.7; 324/542; 324/539; 324/556
(58) Field of Search ........................... 340/384.1, 384.6, 340/384.7; 324/542, 539, 556

(56) References Cited

U.S. PATENT DOCUMENTS

| | | | |
|---|---|---|---|
| 4,282,479 | * | 8/1981 | Deboo et al. ............................ 324/51 |
| 4,814,693 | * | 3/1989 | Coben ..................................... 324/66 |
| 4,837,488 | * | 6/1989 | Donahue ................................. 324/66 |

\* cited by examiner

*Primary Examiner*—Daniel J. Wu
*Assistant Examiner*—Tai T. Nguyen

(57) ABSTRACT

Device for identifying multiple two-conductor alarm wires originating from a common location but terminating at individual remote locations. This device is utilized at the common location by connecting a plurality of test leads and common leads to wires to be identified. User then visits the remote locations where alarm wires connected to test leads and common leads are suspected to terminate. Device emits frequency pulses along connected wires. Using an inductance amplifier probe user can locate and verify that the wire at the remote location is indeed connected to the device. If necessary the user can find the wire it buried within the wall and when found, strip back insulation of the same terminating end of alarm wire and momentarily join the two conductors together. The result is a number of audible beeps sounding from a piezoelectric transducer from the device letting user, who is at the remote location, know which test lead is connected to the wires that were momentarily joined together. In addition to the audible beeps produced by a piezoelectric transducer the invention imposes frequency pulses along all connected wiring corresponding to the number of beeps emitted by the piezoelectric transducer so that a user could count the pulses using an inductance amplifier probe at very distant locations whereby the use of an audible buzzer would not prove usefull.

1 Claim, 6 Drawing Sheets

```
;Complete Code for Alarm-Wire Identifier by Jimmie Judd
;
;********Variable Assignment*****************************************

COUNT1   =       08H            ;DELAY VARIABLE
COUNT2   =       09H            ;DELAY VARIABLE
COUNT3   =       0AH            ;COUNTER VARIABLE#1
COUNT4   =       0BH            ;DELAY VARIABLE
FREQ     =       0CH            ;TONE FREQUENCY VARIABLE
DURATE   =       0DH            ;COUNTER VARIABLE#2

RESET   START
         ORG     0

START
         MOV     !RA, #0000B    ;MAKE RA OUTPUTS

MOV     !RB, #255      ;RB IS ALL INPUTS
         MOV     RA,#0000B      ;CLR RA
         MOV     COUNT4,#8
         CALL    DELAY          ;CALL THIS DELAY ONCE TO STABILIZE CIRCUITRY
LOOP

CALL    TONER          ;CALL TONER SUBROUTINE

SETB    RA.2           ;ACTIVATE PULLUP RESISTORS

MOV     COUNT3,#1      ;THIS SETS TONER SILENCE DURATION BELOW

;********Detection and Discrimination Subroutine*********************

LOOP2
         JNB     RB.0, ONE
         JNB     RB.1, TWO
         JNB     RB.2, THREE
         JNB     RB.3, FOUR
         JNB     RB.4, FIVE
         JNB     RB.5, SIX
         JNB     RB.6, SEVEN
         JNB     RB.7, EIGHT

DJNZ    COUNT1,LOOP2   ;THE NEXT 3 LINES ARE FOR TONER SILENCE AND-
         DJNZ    COUNT2,LOOP2   ;-DURING THAT SILENCE, THE DEVICE CHECKS TO-
         DJNZ    COUNT3,LOOP2   ;SEE IF ANY TEST LEAD IS TRIGGERING.

JMP     LOOP           ;JMP TO LOOP TO GET TONE FROM TONER SUBROUTINE

;*********Counter Assignment Subroutine******************************

ONE      MOV     COUNT3,#1
         CALL    BEEPER
         JMP     LOOP
TWO      MOV     COUNT3,#2
         CALL    BEEPER
         JMP     LOOP
THREE    MOV     COUNT3,#3
         CALL    BEEPER
         JMP     LOOP
FOUR     MOV     COUNT3,#4
         CALL    BEEPER
         JMP     LOOP
FIVE     MOV     COUNT3,#5
```

Fig 4a

```
              CALL     BEEPER
              JMP      LOOP
SIX           MOV      COUNT3,#6
              CALL     BEEPER
              JMP      LOOP
SEVEN         MOV      COUNT3,#7
              CALL     BEEPER
              JMP      LOOP
EIGHT         MOV      COUNT3,#8
              CALL     BEEPER
              JMP      LOOP

;*********Piezo Buzzer Activation*****************************************

BEEPER

SETB     RA.1
              MOV      COUNT4,#8
              CALL     DELAY
              CLRB     RA.1
              MOV      COUNT4,#4
              CALL     DELAY3   ;(TONER COUNTER HERE)
              DJNZ     COUNT3, BEEPER
              MOV      RA,#0
              SETB     RA.2     ;(SETS PULLUP RESISTORS TO ELIMINATE CAPACITANCE)
              MOV      COUNT4,#12 ;(SEE BELOW COMMENT)
              CALL     DELAY    ;(THIS PUTS TONER SILENCE AFTER LAST TONER COUNT)
              RET

DELAY

DJNZ     COUNT1,$
              DJNZ     COUNT2,DELAY
              DJNZ     COUNT4,DELAY
              RET

DELAY2

DJNZ     COUNT1,$
              DJNZ     FREQ,DELAY2
              RET

DELAY3                                      ;USED FOR TONER COUNTER BEEPS!!!

DJNZ     COUNT1,$
              XOR      RA,#0100B
              DJNZ     COUNT2,DELAY3
              DJNZ     COUNT4,DELAY3
              RET

;******TONE***************************************************************

TONER

MOV      COUNT2,#2           ;SETUP DURATION OF TONE
:LOOP1        XOR      RA,#0100B
              MOV      FREQ,#1             ;SET THE FREQUENCY OF TONE
              CALL     DELAY2
              DJNZ     DURATE,TONER:LOOP1  ;THE NEXT THREE LINES ARE FOR TONE
DURATION
              DJNZ     COUNT2,TONER:LOOP1
              RET
```

Fig 4b

AUDIBLE ALARM-WIRE IDENTIFIER

CROSS REFERENCES TO RELATED APPLICATIONS

This application is a continuation-in-part to my previously submitted and now pending application Ser. No. 09/543,902 filed Apr. 6, 2000.

BACKGROUND

1. Field of Invention

This invention relates to electronic tool devices, more specifically a device used to identify multiple two-conductor alarm wires that originate from a common location and terminate at individual remote locations.

2. Description of Prior Art

Two-conductor alarm wire is used in the installation of hard-wired alarms systems. The two-conductor alarm wire connects the remotely placed sensors to a main control panel. In residential and commercial applications the sensors could monitor windows, doors, phone service panels or other items that need to be monitored by an alarm system. During installation of such an alarm system identification of conductor pairs necessary for the sensors can be a time consuming task on applications that require the monitoring of many windows and doors, especially if they are located at distant remote locations.

An extensive search was done for prior art in this field of invention but nothing revealed itself to be close to my invention except U.S. Pat. No. 4,471,293 by inventor Otto Schnack issued on Sep. 11, 1984. U.S. Pat. No. 4,471,293 is a multi-conductor cable test unit for testing multi-conductor cables for shorts, broken wires and crossed wires. U.S. Pat. No. 4,471,293 uses light-emitting diodes to indicate status of tests it is performing on cables. It does not provide a way to immediately alert the user of its status while user is at a remote location. Nor does the invention provide a way to locate buried wires within wall of a structure. Nothing is currently available with the ability to perform these two tasks simultaneously.

SUMMARY INCLUDING OBJECTS AND ADVANTAGES

An audible alarm-wire identification tool, comprises a plurality of test leads conductors and common lead conductors. The conductors connect to an electronic circuit which comprises a micro-controller programmed to monitor the conductors and control activation of a piezo-electric transducer. The micro-controller also imposes frequency pulses onto the test lead conductors during monitoring of the test leads in a way unlike any other device available. This feature allows an inductance amplifier probe to pick up the frequency pulses along the lengths any alarm wires connected to the test lead conductors. Any alarm wires that are connected to the test lead conductors could be located by an inductance amplifier probe should the alarm wires happen to be buried behind walls. The electronic circuitry will sound an appropriate number of beeps from a piezo-electric transducer if any of the connected alarm wires being monitored creates a complete circuit between any of the test lead conductors and any of the common lead conductors. This triggering action could be the result of a cutting tool used at the remote opposite end of the connected alarm wire due to the metallic blades momentarily shorting the two conductors of the alarm wire, one lead is connected to a test lead conductor of the invention while the other lead is connected to a common lead conductor of the invention. The electronic circuitry simultaneously imposes an appropriate number of frequency pulses to the test leads. The frequency pulses correspond to the number of beeps emitted by the piezo-electric transducer. This feature will allow a user of the invention to pick up the frequency pulses with an inductance amplifier probe should he or she be at such a great distance away from the invention that a piezo-electric transducer could not be heard. The design of the circuitry causes the frequency pulses to be imposed on every test lead conductor. Since it is impossible for the user to be at every remote location a connected alarm wire terminates this is a very acceptable design.

OBJECTS AND ADVANTAGES

Accordingly, several objects and advantages of this invention are portability, quantity and quality of unique functions and, ease of use resulting in increased user efficiency during identification of, and quality control of alarm system installations.

Still further objects and advantages will become apparent from a consideration of the ensuing description and accompanying drawings.

BRIEF DESCRIPTION OF THE DRAWINGS

FIG. 4a is a software program used by IC2 in FIG. 3

FIG. 4b is a continuation of FIG. 4a.

Figure 1:
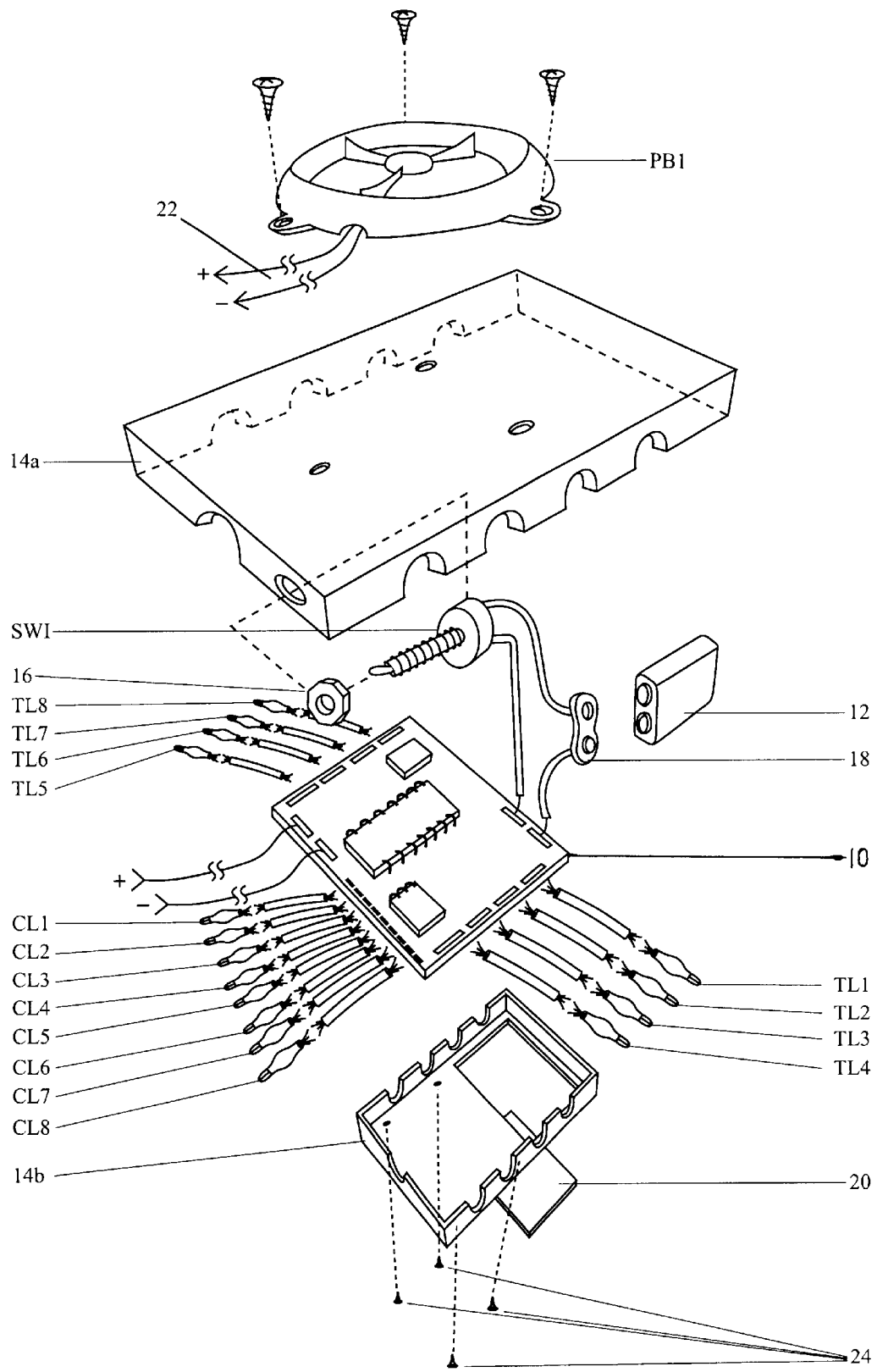
FIG. 1 is a perspective view of the invention.

REFERENCE NUMERALS 10 electronic circuit board
12 nine-volt battery
14 plastic case
16 nut
18 9 volt battery clip
20 removable battery door
22 wire leads
24 small screws
26 window
28 alarm wire
30 remote location
32 alarm closet
34 terminating end of alarm wire
36 originating end of alarm wire
38 audible alarm wire identifier
40 inductive amplifier probe
42 case halves

SUMMARY

An audible alarm-wire identification tool, comprises a plurality of test leads conductors and common lead conductors. The conductors connect to an electronic circuit which comprises a micro-controller programmed to monitor the conductors and control activation of a piezo-electric transducer. The micro-controller also imposes frequency pulses onto the test lead conductors during monitoring of the test leads in a way unlike any other device available. This feature allows an inductance amplifier probe to pick up the frequency pulses along the lengths any alarm wires connected to the test lead conductors. Any alarm wires that are connected to the test lead conductors could be located by an inductance amplifier probe should the alarm wires happen to be buried behind walls. The electronic circuitry will sound an appropriate number of beeps from a piezo-electric transducer if any of the connected alarm wires being monitored creates a complete circuit between any of the test lead conductors and any of the common lead conductors. This triggering action could be the result of a cutting tool used at the remote opposite end of the connected alarm wire due to the metallic blades momentarily shorting the two conductors of the alarm wire, one lead is connected to a test lead conductor of the invention while the other lead is connected to a common lead conductor of the invention. The electronic circuitry simultaneously imposes an appropriate number of frequency pulses to the test leads. The frequency pulses correspond to the number of beeps emitted by the piezolectric transducer. This feature will allow a user of the invention to pick up the frequency pulses with an inductance amplifier probe should he or she be at such a great distance away from the invention that a piezoelectric transducer could not be heard. The design of the circuitry causes the frequency pulses to be imposed on every test lead conductor. Since it is impossible for the user to be at every remote location a connected alarm wire terminates this is a very acceptable design.

PREFERRED EMBODIMENT—DESCRIPTION

FIG. 1 is a general perspective view of the invention.

Electronic circuit board 10 and nine-volt battery 12 are housed in a plastic case consisting of an upper half 14a and lower half 14b. Test leads TL1 through TL8 are comprised of insulated wire approximately 10 inches in length with insulated alligator clips, better shown in FIG. 2, soldered on one end . The other ends of TL1 through TL8 are soldered to points on the electronic circuit board 10 better shown in FIG. 3. Common leads CL1 through CL8 are also approximately 10 inch lengths of insulated wire with insulated alligator clips soldered on one end with the other end soldered to the electronic circuit board 10 better shown in FIG. 3. Test leads TL1 through TL8 pass through numbered holes drilled on the left and right sides of plastic case halves 14a and 14b with their relative position better shown in FIG. 2. Common leads CL1 through CL8 pass through one large hole drilled on the front side of plastic case halves 14a and 14b also better shown in FIG. 2. Also passing through front side of plastic case halves 14a and 14b to one side of hole drilled for CL1 through CL8 is a power switch SW1. SW1 passes through a drilled hole and is affixed by use of a nut 16 on the exterior of case. A nine-volt battery clip 18 connects between SW1 and electronic circuit board 10. This arrangement is seen in FIG. 1 with technical details better shown in FIG. 3. Affixed to the exterior of the upper plastic case half 14a is a piezoelectric buzzer PB1. PB1 has two wire leads 22 that pass through same hole that CL1 through CL8 pass through and then connect to electronic circuit board 10. This connection is seen in FIG. 3. Nine-volt battery 12 can be replaced by means of removable battery door 20 located on lower half of plastic case 14b. Case halves 14a and 14b are fastened together by small screws 24. PB1 is attached to upper plastic case half 14a by adhesive glue (not shown).

Figure 2:
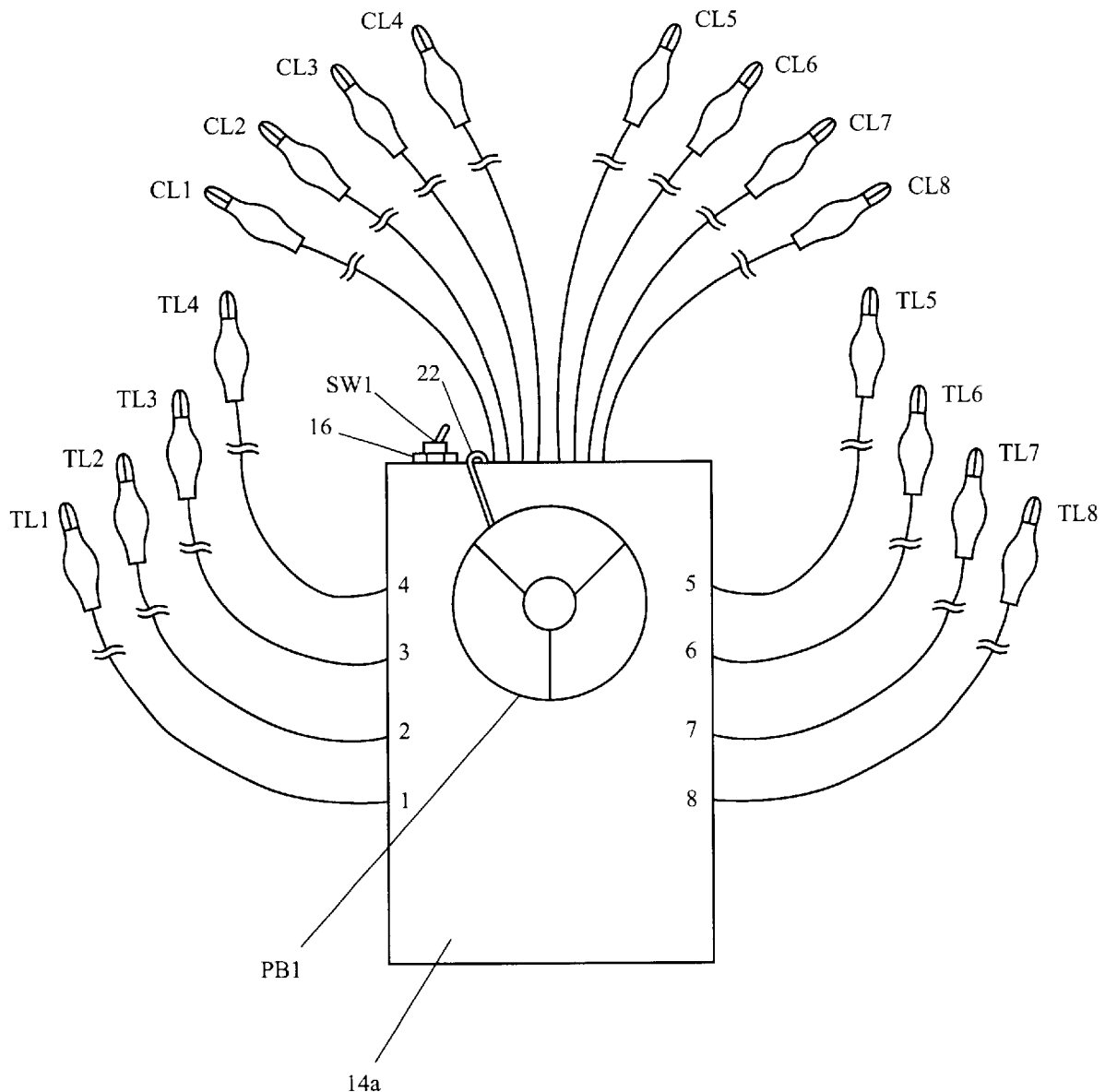
FIG. 2 is a top view of the invention when assembled.
Figure 3:
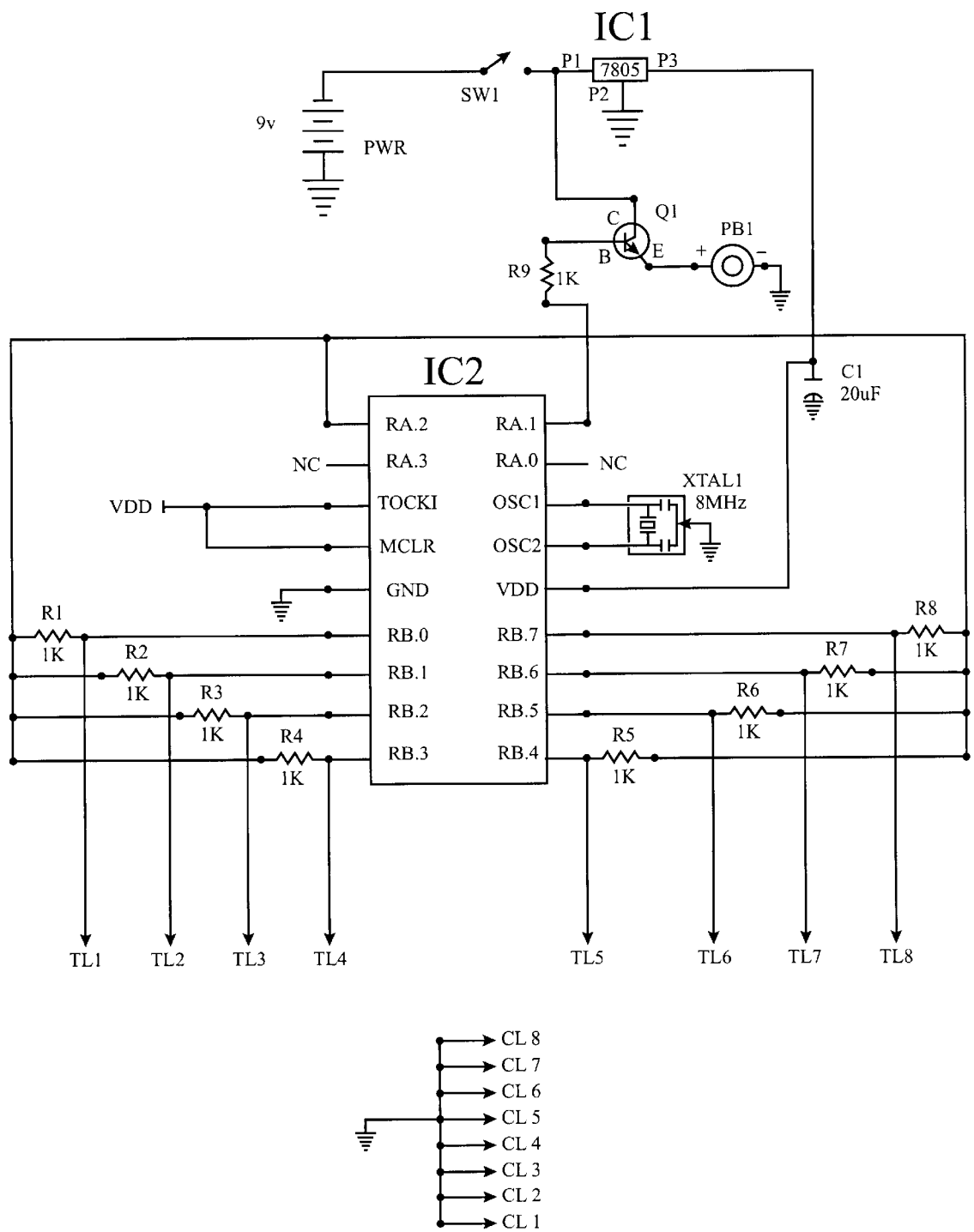
FIG. 3 is a complete schematic of the electronics used in the device.

FIG. 2 is a top view of the invention when assembled. The view shown in FIG. 2 depicts the relative positions of exterior components.

FIG. 3 is a schematic of electronic circuit board 10.

IC2 is a PIC16C56 micro-controller which is responsible for the operation of the invention in conjunction with a program listed in FIG. 4 programmed into its memory Resistors R1 through R8 are each rated at 1 K Ohms. Connected to RB.0 of IC2 is R1. R1 then connects to RA.2 of IC2. Connected to RB.1 of IC2 is R2 which then also connects to RA.2 of IC2. Resistors R3 through R8 are respectively connected to RB.2 through RB.7. Resistors R3 through R8 then connect to RA.2 as did R1 and R2. Test leads TL1 through TL8 connect to RB.0 through RB.7 at the same points of connection of R1 through R8 respectively. XTAL1 is an 8 MHz ceramic resonator used to supply IC2 with clock pulses for operation. It connects to points OSC1 and OSC2 of IC2 with its ground pin connected to ground. MCLR and TOCKI both connect to VDD of IC2. VDD of IC2 then connects to P3 of IC1. IC1 is a 78L05 5 volt regulator. P2 of IC1 is connected to ground as is GND of IC2. P1 of IC1 then connects to SW1 which is a SPST switch. The other terminal of SW1 then connects to positive side of said nine-volt battery in FIG. 1 with the negative side of connector connected to ground as shown in FIG. 3. Connected to RA.1 is resistor R9 which is rated at 1 K Ohms. Q1 is a small signal switching NPN transistor. B of Q1 connects to opposite end of R9. C of Q1 connects to P1 of IC1 at same point of connection with SW1. PB1 is a nine-volt piezoelectric buzzer with positive and negative leads. The positive lead of PB1 connects to E of Q1. The negative lead of PB1 connects to ground. C1 is a 20 $\mu$F electrolytic capicitor. Positive lead of C1 connects to P3 of IC1 with the negative lead connecting to ground. Common Leads CL1 through CL8 all connects to ground at the circuit board.

FIG. 4 is a listing of the program used by IC2 in FIG. 3.

FIG. 4 is better understood by explaining how it works. This is discussed in the next section in detail. However, the subroutines of the program are the variable assignment subroutine, tone subroutine, detection/discrimination subroutine, counter assignment subroutine and, a piezo buzzer activation subroutine.

Figure 5:
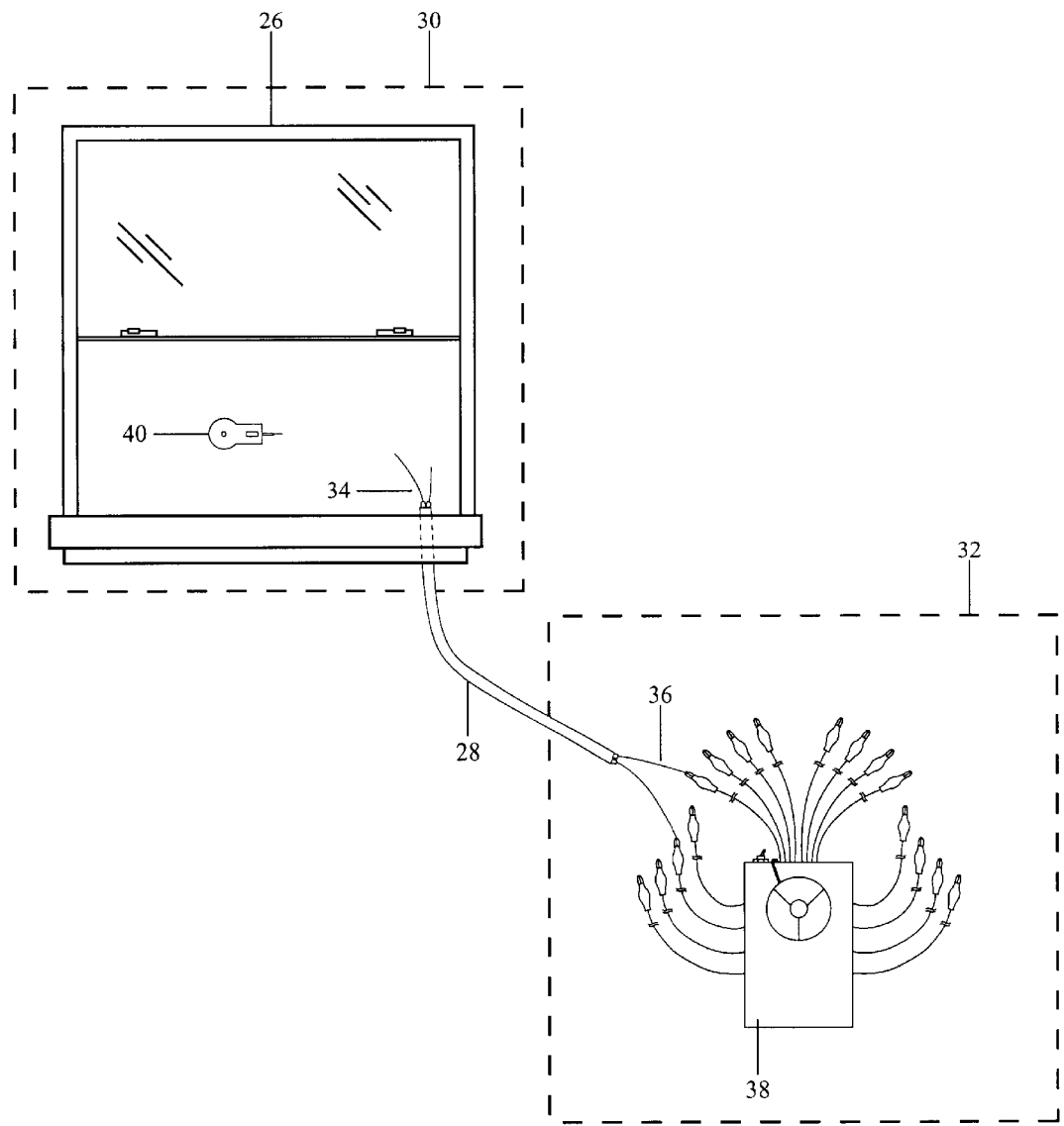
FIG. 5 is a pictorial scenario of invention usage.

FIG. 5 is a diagram of invention usage.

In FIG. 5 a window 26 is located at the remote location 30 where alarm wire 28 from alarm closet 32 originates. Terminating end of alarm wire 34 and originating end of alarm wire 36 are shown. An audible alarm wire identifier 38 is shown connected to originating end of alarm wire 36. Usage of an inductive amplifier probe 40 is shown.

PREFERRED EMBODIMENT—OPERATION

A currently available prototype of the audible alarm-wire identification tool functions as follows. Power from nine-volt battery 12 is supplied to IC1 when SW1 is closed. IC1 which is a 5 volt regulator then supplies power to IC2. IC2 then executes a program in FIG. 4 which is programmed into its memory. IC2 executes the following steps:

1) Variables are assigned for use by counters and delays in the variable assignment subroutine.

2) Ports of IC2 are either set as inputs or outputs.

Program in FIG. 4 then enters the main loop which does the following:

3) A tone subroutine is executed to impose a duration of frequency pulses on TL1 through TL8.

4) The program then enters a detection/discrimination subroutine. TL1 through TL8 no longer have a frequency imposed upon them. The detection/discrimination routine detects circuit completion between test leads and common leads for a short period of time.

5) If the detection/discrimination subroutine does not sense any one test lead TL1 through TL8 to complete a circuit with any one common lead CL1 through CL8 the program simply jumps back to step 3. This looping is where the frequency pulses are created for locating buried wires.

However, if the detection/discrimination subroutine does sense any one test lead TL1 through TL8 completing a circuit (negative triggering) with any one common lead CL1 through CL8 then the following steps are executed, 6) A counter assignment subroutine assigns a corresponding number from 1 to 8 to represent TL1 to TL8 to a variable to be used in a counter. This assignment depends on which one of TL1 through TL8 was to complete a circuit with any one of CL1 through CL8.

7) A peizo buzzer activation subroutine is then executed to emit audible beeps corresponding to the number of the test lead completing a circuit with any common lead. Audible beeps range from 1 to 8 in the working prototype since their are only 8 test leads. The silence periods of the piezo buzzer beeps occurs in Delay 3. During these silence periods a frequency is imposed on TL1 through TL8. On the other hand when the piezo buzzer is sounding no frequency is imposed on TL1 through TL8. These pulses of frequency on TL1 through TL8 allows an inductance amplifier to detect the corresponding number of beeps the piezo buzzer is sounding. The assigned variable in the counter is subtracted for every cycle of beep and silence and when it variable is equal to zero the program simply jumps to step 3.

The electronic components involved during program execution can be explained by elaborating on the previous steps:

1) Variables are assigned for use by counters and delays.

This step does not involve any exterior electronic components connected to IC2.

2) Ports of IC2 are either set as inputs or outputs.

RB.0 through RB.7 of IC2 are assigned as inputs. RA.3 and RA.0 of IC2 are not used as inputs or outputs. RA.2 and RA.1 of IC2 are assigned as outputs.

Program in FIG. 4 then enters the main loop which does the following:

3) A tone subroutine is executed to impose a frequency on TL1 through TL8 for a programmed short duration.

RA.2 is rapidly changing from a state of 5 volts to 0 volts at a programmed rate and duration during this period of program execution. Resistors R1 through R8 which are used as 5 volt pull-up resistors pass these frequency pulses to test leads TL1 through TL8. If an inductance amplifier probe is used near any test lead TL1 through TL8 or any wires connected to the alligator clips of test leads TL1 through TL8 the probe would allow the user to hear these frequency pulses as an audible tone. This is the unique feature that is useful for locating wires buried within the walls of a house or commercial building.

4) After a programmed period the program then enters a detection/discrimination subroutine. The duration of the detection/discrimination is also programmed. During this period of program execution RA.2 no longer is changing from 5 volts to 0 volts at a programmed frequency but is set to constantly output 5 volts across resistors R1 through R8 which now act as common pull-up resistors. Thus, RB.0 through RB.7 senses the voltage passed from resistors R1 through R8.

5) If the detection/discrimination subroutine does not sense any one test lead TL1 through TL8 to complete a circuit with any one common lead CL1 through CL8 the program simply jumps back to step 3. Any completed circuits made in this manner are grounding one of resistors R1 through R8. Thus IC2 can detect and discriminate which of RB.0 through RB.7 is being negatively triggered.

Program execution simply jumps back to step 3 as long as RB.0 through RB.7 continues to sense 5 volts for the short programmed duration.

However, if the detection/discrimination subroutine does sense any one test lead TL1 through TL8 to complete a circuit with any one common lead CL1 through CL8 the following steps are executed:

6) An assignment subroutine assigns a corresponding number from 1 to 8 to represent TL1 to TL8 to a variable to be used in a counter. This assignment depends on which one of TL1 through TL8 was to complete a circuit with any one of CL1 through CL8. The test lead which does so grounds the corresponding pull-up resistor connected to inputs RB0 through RB7 thus making the affected input sense ground. The assignment subroutine then assigns the corresponding number of the test lead completing the circuit to a variable that is used in a counter. For example, If test lead TL3 is the test lead completing the circuit the number 3 will be assigned to the variable.

7) A piezo buzzer activation subroutine is then executed and once completed the program jumps to steps 3.

Piezo buzzer PB1 would sound 3 times if the number 3 were assigned to the variable used by the counter. PB1 is switched on and off by switching transistor Q1. Q1 is normally off when B of Q1 is not biased through R9 at 5 volts supplied from RA.1. So by switching RA.1 from outputting 5 volts to 0 volts in intervals determined by the number stored in the variable used by the counter, number 3 in this case, PB1 will sound 3 times. Simultaneously during the period of 0 volts supplied by RA.1 to silence the piezo buzzer, RA.2 is cycling on and off at a programmed rate to impose a frequency across R1 through R8 and consequently passing the frequency to TL1 through TL8. So while the piezo buzzer is sounding, no frequency is being imposed on TL1 through TL8 but, while piazo buzzer is silent, a frequency is being imposed on TL1 through TL8. After the counter in this example counts down 3 times the piezo buzzer will have sounded 3 times and a frequency will have been imposed 3 times. RA.1 then outputs 0 volts to keep PB1 off and the program jumps to steps 3 executing a contiuous series until power is interrupted by turning SW1 off.

FIG. 5 demonstrates physical usage of audible alarm-wire identifier 38. In this demonstration user would connect test lead TL4 and any one of common lead CL1 through CL8 to originating end of alarm wire 36. Alarm wire 28 is a two-conductor cable so test lead TL1 connects to one conductor and any one of common lead CL1 through CL8 connects to the second conductor. Audible alarm-wire identifier 38 is powered on and user would go to remote location 30. If user were to bring inductive amplifier probe near terminating end of alarm wire 34, user would hear a 1 KHz tone beeping on and off alerting user that alarm wire 28 is indeed connected to audible alarm-wire identifier 38. This function of audible alarm-wire identifier 38 not only allows user to immediately know that alarm wire 28 is indeed connected to audible alarm-wire identifier 38, but also allows user to find terminating end of alarm wire 34 if it happens to be buried inside of a wall on accident. Once user has confirmed that alarm wire 28 is indeed connected to audible alarm-wire identifier 38 via usage of inductance amplifier probe user then strips the insulation from terminating end of alarm wire 34 and momentarily joins the two conductors together. Audible alarm-wire identifier 38 senses the joining of the two conductors and will sound 4 beeps in response. User will then know that terminating end of alarm wire 34 is connected to test lead TL4 of audible alarm-wire identifier 38.

In this demonstration its known that test lead TL4 of audible alarm-wire identifier 38 is connected to originating end of alarm wire 36 in alarm closet 32. In an actual situation the user would not know the fact that terminating end of alarm wire 34 of alarm wire 28 is connected to originating end of alarm wire 36 and that is the purpose of using an audible alarm-wire identifier 38. In an acutual situation the user has test leads TL1 through TL8 to utilize in identifying alarm wires at other remote locations. By utilizing all 8 test leads the user will spend less time trying to identify alarm wires at other remote locations. User will immediately know whether to spend time at that remote location or move on to the next remote location to identify a new alarm wire.

CONCLUSIONS, RAMIFICATIONS, AND SCOPE

Accordingly, it can be seen that according to the invention, I have provided a means to simplify the indentification of alarm wires used in alarm installations. By utilizing programmable electronics the invention is compact, cost effective and easy to use. Alarm installations will require less customer service from improper identification of wires and the actual alarm installation will require less time to complete.

Although the description above contains many specificities, these should not be construed as limiting the scope of the invention but as merely providing illustrations of some of the presently preferred embodiments of this invention. Various other embodiments and ramifications are possible within it's scope. For example, more test leads could easily be included to audible alarm wire identifier 38 using a micro-processor having more I/O ports. In addition the invention is not limited to only identifying alarm wires but any type of multi conductor wiring originating from a common location and terminating at individual remote locations. Thus the scope of the invention should be determined by the appended claims and their legal equivalents, rather than by the examples given.

What is claimed is:

1. An electronic multiconductor wire locating and identification tool, said electronic multiconductor wire locating and identification tool comprising:

a. electronic circuitry means imposing a frequency pulse train along a plurality of multiconductor wire runs;

b. said electronic circuitry means simultaneously utilizing said plurality of multiconductor wire runs as one-shot trigger source;

c. said electronic circuitry means thus imposing another series of unique numerical frequency pulses along said plurality of multiconductor wire runs when said electronic circuitry means is triggered.

d. said electronic circuitry means further to include an embedded software program comprising:
   1) first means for imposing said frequency pulse train along said plurality of multiconductor wire runs;
   2) second means for detecting and discriminating which of the said plurality of multiconductor wire runs were to cause said one-shot trigger; and
   3) third means for setting counter subroutine for imposing upon said plurality of multiconductor wire runs a said series of unique numerical frequency pulses along said plurality of multiconductor wire runs;

whereby said electronic multiconductor wire locating and identifying tool utilizes said multiconductor wire runs to simultaneously serve uniquely as a locating medium, triggering medium and, identifying medium in the attempts to locate and identify same said multiconductor wire runs.

* * * * *